United States Patent [19]

Silver

[11] Patent Number: 5,104,818
[45] Date of Patent: Apr. 14, 1992

[54] PREIMPLANTED N-CHANNEL SOI MESA

[75] Inventor: John Silver, Colorado Springs, Colo.

[73] Assignee: United Technologies Corporation, Hartford, Conn.

[21] Appl. No.: 684,744

[22] Filed: Apr. 15, 1991

[51] Int. Cl.$^5$ .......................................... H01L 21/265
[52] U.S. Cl. .................................. 437/41; 437/21; 437/45; 437/46; 437/84; 148/DIG. 150
[58] Field of Search .................. 437/21, 41, 45, 46, 437/84, 984; 148/DIG. 150

[56] References Cited

U.S. PATENT DOCUMENTS

| | | | |
|---|---|---|---|
| 4,317,686 | 3/1982 | Anand et al. | 148/1.5 |
| 4,373,254 | 2/1983 | Blumenfeld | 437/21 |
| 4,463,492 | 8/1984 | Maeguchi | 437/46 |
| 4,599,789 | 7/1986 | Gasner | 29/571 |
| 4,700,461 | 10/1987 | Choi et al. | 437/41 |
| 4,727,044 | 2/1988 | Yamazaki | 437/46 |
| 4,766,482 | 8/1989 | Smeltzer et al. | 437/21 |
| 4,791,464 | 12/1988 | Ipri et al. | 357/23.7 |
| 4,899,202 | 2/1990 | Blake et al. | 357/23.7 |
| 4,906,587 | 3/1990 | Blake | 437/41 |
| 4,943,837 | 7/1990 | Konishi et al. | 437/21 |
| 4,946,799 | 8/1990 | Blake et al. | 437/41 |
| 4,965,872 | 10/1990 | Vasudev | 357/35 |

Primary Examiner—Brian E. Hearn
Assistant Examiner—Kevin M. Picardat

[57] ABSTRACT

A silicon on insulator circuit having transistors formed in isolated mesas initially doped P$^{--}$ has the mesas for N-channel transistors counterdoped to a N$^{--}$ concentration, after which a field insulating layer is put down over an outer portion of the N-channel mesas and N-channel transistors with N+ sources and drains are formed, so that the N+ areas are adjacent the counterdoped N$^{--}$ areas, thereby eliminating P—N junction found in prior art devices.

4 Claims, 2 Drawing Sheets

PREIMPLANTED N-CHANNEL SOI MESA

DESCRIPTION

1. Technical Field

The field of the invention is that of silicon integrated circuit processing, in particular, the field of silicon on insulator (SOI) circuits, in which the circuit elements are formed in a thin layer of silicon above an insulating layer.

2. Background Art

In previous SOI integrated circuits, the mesas in which transistors are constructed are conventionally doped P$-$-. For the N-channel transistors, the sources and drains will be doped heavily with an N++ concentration, so that there is a P-N junction between the outer edges of the sources and drains and the remaining portion of the mesa. This junction not only adds capacitance to the sources and drains, but also increases the collection volume for radiation induced charges.

DISCLOSURE OF INVENTION

The invention relates to an improved silicon mesa process in which the outer edge of the mesa that is to be used for an N-channel transistor is doped with an implant sufficient to change the polarity from P$-$ to N$-$.

Other features and advantages will be apparent from the specification and claims and from the accompanying drawings which illustrate an embodiment of the invention.

BEST MODE FOR CARRYING OUT THE INVENTION

Figure 2A:
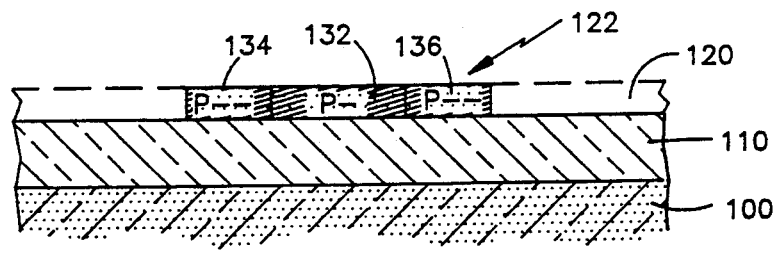
FIGS. 2a-2c illustrate in cross section a silicon mesa formed according to the prior art.

Referring now to FIG. 2a, there is shown a cross section of a silicon mesa constructed according to the prior art. A substrate 100 of bulk silicon has in its top portion a buried oxide layer 110 constructed conventionally. Above layer 110, there is a layer of P$-$$-$ silicon denoted generally by the numeral 120 which has previously been etched into isolated mesa 122. Mesa 122 is for an N-channel transistor, in which central portion 132 is the area that will be the channel and regions 134 and 136 will be the source and drain. The nominal dopant concentration in layer 120 is $10^{14}/cm^3$.

Figure 2B:
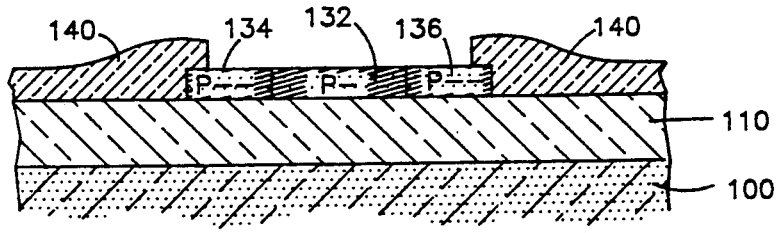
Figure 2C:
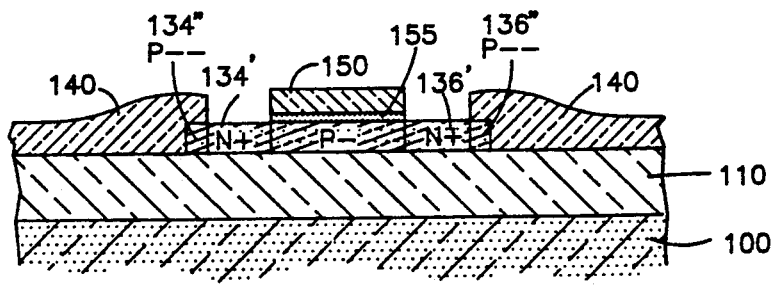

In order to have correct alignment, it is necessary to make the outer boundaries of the source and drain smaller than the size of the mesa, to allow for alignment errors. Field oxide 140 in FIG. 2b, therefore, will extend over the edge of mesa 122 with some tolerance so that there is an overlap area that will not be implanted when the source/drain implant is performed. In FIG. 2c, which illustrates the mesa after the implantation of the source and drain, there are left over portions 134" and 136" that are doped with the original P$-$$-$ concentration of the original silicon layer because they are protected by field insulator 140 during the implantation of source and drain. There is thus a P-N junction between P$-$$-$ area 134" and N+ area 134' and between P$-$$-$ area 136" and N+ area 136. These areas 134" and 136" will be covered by the insulating field layer when the circuit has finished, but trapped charge may migrate to that region and cause inversion or leakage across the P-N junction Further, the depletion region formed by the P-N junctions will increase the capacitance of the sources and drains, slowing down the circuit. In addition, the depletion region serves to increase the collection volume for stray charge released by ionizing radiation.

Figure 1A:
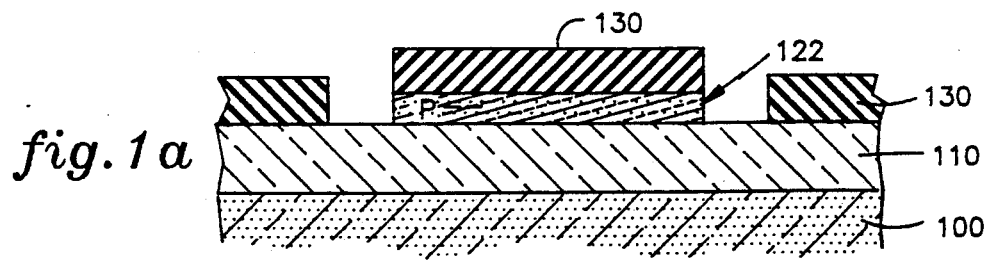
FIGS. 1a-1f illustrate in cross section different steps in forming a silicon mesa according to the invention.

Referring now to FIG. 1a, there is shown a portion of a silicon substrate in which a transistor will be formed according to the invention. The same substrate 100, buried layer 110 and silicon layer 120 are shown as in FIG. 2. Photoresist 130 has protected mesa 122 during the etch process.

Figure 1B:
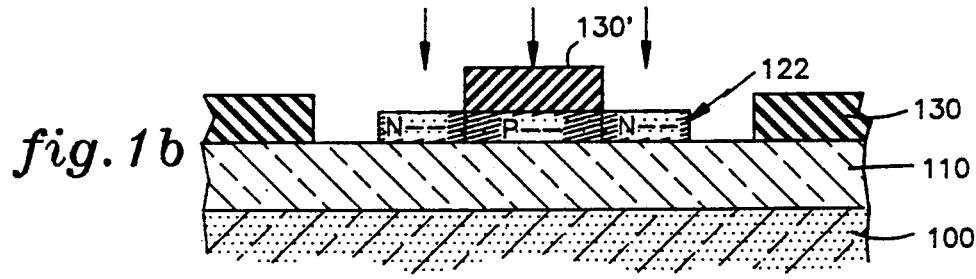

FIG. 1b illustrates silicon mesa 122, during the counterdoping implantation of the mesa. A second layer of photoresist 130 has been deposited on the substrate and an oversized aperture about the mesa has been formed. An additional portion of photoresist, 130', protects the future channel region of the transistor while the remainder of mesa 122 is implanted with N-type ions to a concentration sufficient to reverse the previous P$-$$-$ concentration and establish an N$-$$-$ concentration. The ion implant is performed with a nominal voltage of 65 Kev and a of $5 \times 10^{11}/cm^2$ sufficient to penetrate through the entire depth of mesa 125 (nominally 1200 Å) and dope it to the new concentration. Several different voltages may be used to ensure uniform coverage through the depth of the mesa.

Figure 1C:
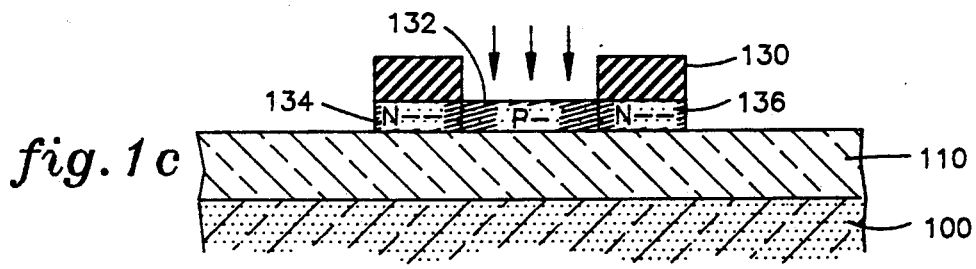

FIG. 1c illustrates the implantation of the channel region (referred to as a well implant) with a dose of $1 \times 10^{13}/cm^2$ at a voltage of 25 Kev to raise the concentration level from the value of about $10^{14/cm}3$ characteristic of P$-$$-$ to a value of approximately $2 \times 10^{17}/cm^3$ characteristic of P$-$. This implant also serves to establish the threshold of the transistor being formed. In the illustrative process, the minimum dose for a P-type silicon layer is about $1 \times 10^{11}/cm^2$ of phosphorous; and the minimum dose for an N-type silicon layer is $2 \times 10^{12}/cm^2$ of boron. Those skilled in the art will readily be able to adjust the implants to account for different initial dopant concentrations and different desired levels of final dopant concentration.

Figure 1D:
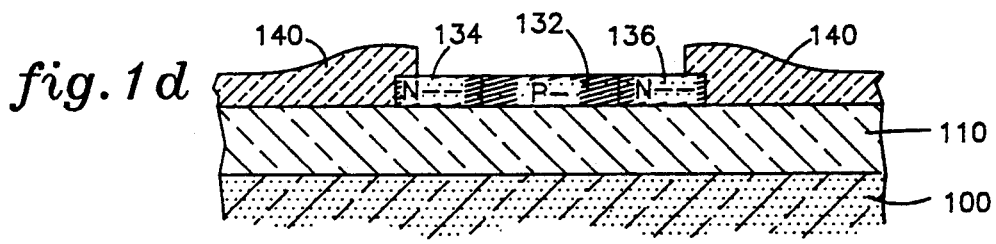
Figure 1E:
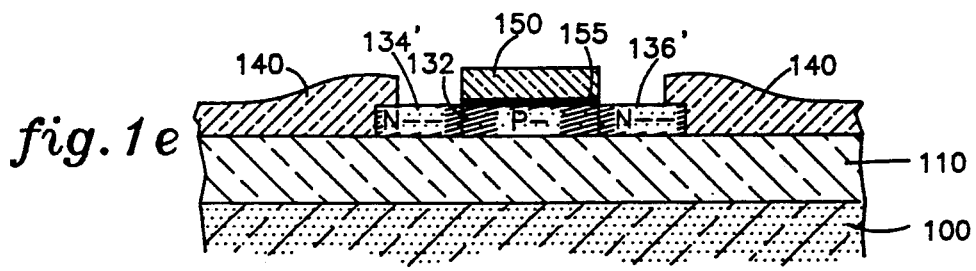

FIG. 1d shows the mesa with a field oxide 140 replacing the photoresist 130. The "active cut" has been made to expose the area that will hold the transistor. FIG. 1e shows a counterpart to FIG. 2a, before the N+ implant is made into source and drain 134' and 136' and after the conventional formation of gate oxide 155 and gate 150.

Figure 1F:
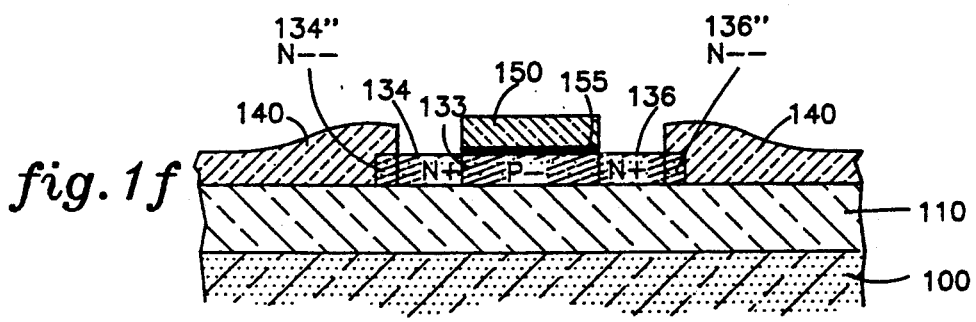

FIG. 1f shows the implantation step with polysilicon gate 135 shown extending perpendicular to the plane of the paper. Outer areas 134" and 136" are shown as having an N$-$$-$ concentration, so that the P-N junctions of the prior art have disappeared.

Those skilled in the art will appreciate that a similar situation will exist for P-channel transistors when the wafer is initially doped N$-$$-$. Further, the invention is applicable to enhancement or depletion transistors. It should be understood that the invention is not limited to the particular embodiments shown and described herein, but that various changes and modifications may be made without departing from the spirit and scope of this novel concept as defined by the following claims.

What is claimed is:

1. A method of forming a transistor in a wafer having a buried layer of insulator below a mesa layer of silicon initially doped to a P$-$$-$ concentration and comprising the steps of:

forming an isolated mesa having a channel region, a source region, and a drain region in said mesa layer;

implanting said isolated mesa outside said channel region with a counterdoping implant sufficient to change said $P^{--}$ concentration to at least an $N^{--}$ concentration;

depositing a field insulating layer above said substrate and above at least an outer portion of said mesa, thereby defining a transistor aperture in said field insulating layer and within said outer portion of said mesa;

defining a channel aperture above said mesa and within said transistor aperture and implanting said channel area with a predetermined channel threshold implant;

forming a gate above said channel area; and implanting said source and drain regions in said mesa and adjacent to said channel area to form a transistor.

2. A method according to claim 1, in which said step of implanting said counterdoping implants a dose of at least $1 \times 10^{11}$ phosphorous ions per square centimeter.

3. A method of forming a transistor in a wafer having a buried layer of insulator below a mesa layer of silicon initially doped to a $N^{--}$ concentration and comprising the steps of:

forming an isolated mesa having a channel region, a source region, and a drain region in said mesa layer;

implanting said isolated mesa outside said channel region with a counterdoping implant sufficient to change said $N^{--}$ concentration to at least a $P^{--}$ concentration;

depositing a field insulating layer above said substrate and above at least an outer portion of said mesa, thereby defining a transistor aperture in said field insulating layer and within said outer portion of said mesa;

defining a channel aperture above said mesa and within said transistor aperture and implanting said channel area with a predetermined channel threshold implant;

forming a gate above said channel area; and implanting said source and drain regions in said mesa and adjacent to said channel area to form a transistor.

4. A method according to claim 3, in which said step of implanting said counterdoping implants a dose of at least $1 \times 10^{12}$ boron ions per square centimeter.

* * * * *